(12) United States Patent
Ko (10) Patent No.: US 8,227,871 B2
(45) Date of Patent: Jul. 24, 2012

(54) SEMICONDUCTOR DEVICE AND METHOD FOR MANUFACTURING THE SAME

(75) Inventor: Choul Joo Ko, Seongnam-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 173 days.

(21) Appl. No.: 12/631,308

(22) Filed: Dec. 4, 2009

(65) Prior Publication Data

US 2010/0140703 A1 Jun. 10, 2010

(30) Foreign Application Priority Data

Dec. 4, 2008 (KR) .................. 10-2008-0122789

(51) Int. Cl.
*H01L 27/092* (2006.01)
*H01L 29/76* (2006.01)

(52) U.S. Cl. ........ 257/370; 257/335; 257/336; 257/337; 257/342; 257/343; 257/499; 257/E21.417; 257/E21.427; 257/E21.545; 257/E29.053; 257/E29.063; 257/E29.256; 257/E29.261; 257/E29.268; 438/286

(58) Field of Classification Search .................. 257/335, 257/336, 337, 342, 343, 370, 499, E21.417, 257/E21.427, E21.545, E29.053, E29.063, 257/E29.256, E29.261, E29.268; 438/286
See application file for complete search history.

(56) References Cited

U.S. PATENT DOCUMENTS

| | | | |
|---|---|---|---|
| 6,831,346 B1 * | 12/2004 | Li et al. ........................ | 257/499 |
| 6,965,504 B2 * | 11/2005 | Liu et al. ........................ | 361/58 |
| 7,514,754 B2 * | 4/2009 | Ma et al. ....................... | 257/370 |
| 7,960,786 B2 * | 6/2011 | Huang et al. .................. | 257/341 |
| 2005/0073007 A1 * | 4/2005 | Chen et al. .................... | 257/355 |
| 2009/0236662 A1 * | 9/2009 | Voldman ....................... | 257/337 |

\* cited by examiner

*Primary Examiner* — Dao H Nguyen
(74) *Attorney, Agent, or Firm* — The Law Office of Andrew D. Fortney; Andrew D. Fortney (57) ABSTRACT

A semiconductor device and a method for manufacturing the same are disclosed. The semiconductor device includes a substrate having a first conductor-type, a buried layer of a second conductor-type on the substrate, a drain, and a first guard-ring on one side of the drain, a second guard-ring on one side of the first guard-ring, and a third guard-ring on one side of the second guard-ring.

20 Claims, 8 Drawing Sheets

SEMICONDUCTOR DEVICE AND METHOD FOR MANUFACTURING THE SAME

CROSS REFERENCE TO RELATED APPLICATION

This application claims the benefit of the Korean Patent Application No. 10-2008-0122789, filed on Dec. 4, 2008, which is hereby incorporated by reference as if fully set forth herein.

BACKGROUND OF THE DISCLOSURE

1. Field of the Disclosure

The present invention relates to a semiconductor device, and more particularly, to a lateral double diffused MOSFET (LDMOS) device and a method for manufacturing the same.

2. Discussion of the Related Art

Generally, a power MOS field-effect transistor (MOSFET) has higher input impedance as compared to a bipolar transistor. For this reason, the power MOSFET advantageously has a larger power gain and a simpler gate driving circuit. Also, as a uni-polar device, the power MOSFET also advantageously has no time delay, which occurs due to an accumulation or recombination caused by a minority carrier during a turn-off period.

Therefore, use of the power MOSFET in switching mode power supply devices, lamp regulation, and motor driving circuits is increasing.

Generally, a double diffused MOSFET (DMOSFET) structure using planar diffusion is broadly used as the above-described power MOSFET. Typically, the DMOSFET structure corresponds to the LDMOS transistor.

SUMMARY OF THE DISCLOSURE

Accordingly, the present invention is directed to a semiconductor device and a method for manufacturing the same that substantially obviates one or more problems due to limitations and disadvantages of the related art.

An object of the present invention is to provide a semiconductor device and a method for manufacturing the same that can maintain a guard-ring (e.g., a P-well) in a LDMOS device, and that can enhance a safe operating area (SOA).

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the invention, as embodied and broadly described herein, a semiconductor device includes a substrate having a first conductor-type, a buried layer of a second conductor-type formed on the substrate, a drain, a first guard-ring formed on one side of the drain, a second guard-ring formed on one side of the first guard-ring, and a third guard-ring formed on one side of the second guard-ring.

In another aspect of the present invention, in a semiconductor device having an active region and a field region, the semiconductor substrate having a first conductor-type, the semiconductor device includes a second conductor-type deep well in the semiconductor substrate, a first conductor-type body in the deep well, a gate electrode on or over the active region, a second conductor-type drain region in a second conductor-type source region in the body and in the second conductor-type deep well, a first guard well in the deep well and having first conductor-type impurities therein, a second guard well in the deep well and having second conductor-type impurities therein, and a third guard well in the deep well and having second conductor-type impurities therein.

In a further aspect of the present invention, a method for manufacturing a semiconductor device includes forming a second conductor-type deep well on a first conductor-type semiconductor substrate, forming a first conductor-type body in the deep well, forming a second conductor-type drain region, a first guard well of a first conductor-type, a second guard well of a second conductor-type, and a third guard well of the second conductor-type, forming a field oxide layer on the semiconductor substrate, forming a gate electrode, forming a first photoresist pattern on the semiconductor substrate and injecting second conductor-type impurities, and forming a second photoresist pattern on the semiconductor substrate and injecting first conductor-type impurities.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present invention, examples of which are illustrated in the accompanying drawings.

Also, in the following description of the present invention, the term "including" does not exclude the existence of elements or process steps other than those cited in the description. Also, in the accompanying drawings, a plurality of layers and regions (or areas) may be shown by enlarging the thickness of such layers and regions. Also, wherever possible, the same reference numbers will be used throughout the drawings to refer to the same or like parts. Furthermore, when a layer, film, region, or substrate is said to be placed "over" another part of the invention, this may not only indicate that the corresponding layer, film, region, or substrate is formed "directly above" the other part of the invention but may also indicate that other parts may be included between the corresponding layer, film, region, or substrate and the other part of the present invention.

Various embodiments of the present invention will now be described in detail with reference to the accompanying drawings.

In the following description, a structure of forming an NPN parasitic capacitor within a substrate and the effect of such structure, preventing leakage of electric current will be described. The following embodiments of the present invention will propose a solution for resolving the problems that may occur in the present invention.

Figure 1:
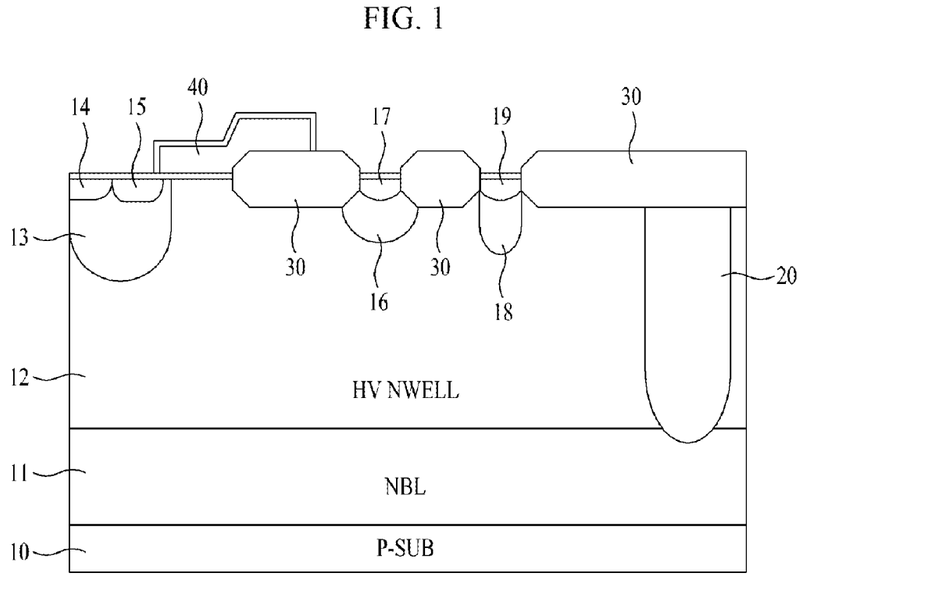
FIG. 1 illustrates a structure of a guard-ring being configured in an LDMOS device, wherein the guard-ring controls leakage current from flowing from a drain to a substrate.

FIG. 1 illustrates a structure of a guard-ring being configured in a lateral double diffused MOSFET (LDMOS) device, wherein the guard-ring controls leakage current from flowing from a drain to a substrate.

Referring to FIG. 1, a P-type semiconductor substrate 10 includes a buried layer 11 formed thereon, and a P-type epitaxial layer (not shown) formed on the buried layer 11.

When voltage is supplied to an N$^+$-drain region 17, the N-type buried layer 11 decreases a width of a depletion layer, which is extended from a P-type body (or P-body) 13, thereby substantially increasing a punch through voltage.

Also, when a gas-phase semiconductor crystal is deposited on or over a mono-crystalline wafer, which acts as a substrate 10, the P-type epitaxial layer can be developed and formed along a crystal axis of a P-type substrate (or P-substrate) 10, thereby reducing the resistance of the P-substrate 10.

Thereafter, an N-type deep well (NWELL) 12 is formed on the P-type semiconductor substrate 10, and the P-body 13 is formed in the NWELL 12.

A channel region is formed according to a bias voltage applied to a gate region 40 near the surface of the P-body 13, which is formed between a contacting surface of the P-body 13, the NWELL 12, and an N$^+$-type source region 15.

Also, an insulation layer 30 is formed in an active region and a field region of the semiconductor device. The insulation layer 30 may include a field oxidation layer, such as silicon oxide, which is thermally grown or developed (e.g., by wet or dry thermal oxidation).

Thereafter, the gate region 40 is formed, and an N-type shallow well 16, an N-type source region 15, and an N-type drain region 17 are formed, and a P-type impurity layer 14 is formed to facilitate contact with the P-body 13.

Additionally, for preventing current from leaking to a substrate axis to the drain region, various embodiments of the present invention comprise a first guard-ring 19, wherein P$^+$-type ions are implanted on a surface of the substrate 10, neighboring the N$^+$-type drain region 17 and/or an N$^+$-type deep well 20. The N$^+$-type deep well 20 may be formed in the surrounding region of the first guard-ring 19.

The first guard-ring 19 may be formed near the drain region of the LDMOS device. At this point, a second guard-ring (e.g., 340 and/or 342 of FIG. 6) may be formed in the surrounding region of the first guard-ring 19.

Similar to the N$^+$-type drain region 17, which is surrounded by an N-type well 16, the first guard-ring 19 may be formed inside of a P-type well 18. The guard-ring 19 and the N$^+$-type deep well 20 forms an NPN parasitic transistor between the N-type deep well (NWELL) 12 and the N$^+$-type deep well 20, and also between the P-type epitaxial layer and the N-type buried layer 11. By using the NPN parasitic transistor, current may be prevented from leaking to the substrate 10.

Hereinafter, a structure for guarding current from leaking to the substrate from the drain region using the guard-ring and the N$^+$-type deep well will now be described in more detail.

Figure 2:
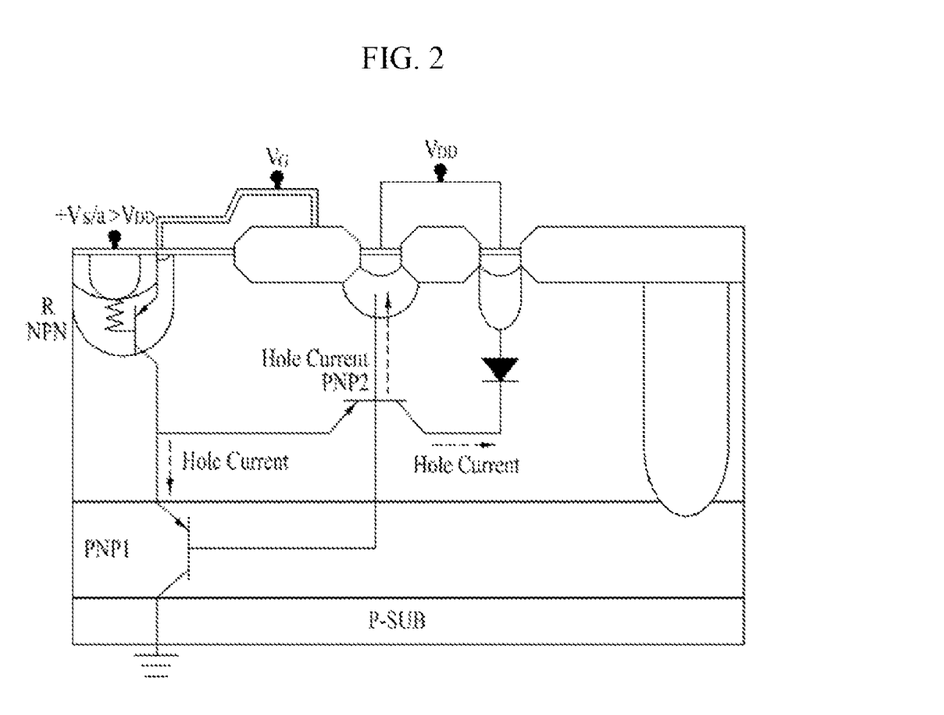
FIG. 2 illustrates a view for verifying electrical characteristics of the semiconductor device shown in FIG. 1.

FIG. 2 illustrates a view for verifying electrical characteristics of the semiconductor device shown in FIG. 1. In the description of FIG. 2, the same reference numbers used in FIG. 1 may be omitted for simplicity.

When the P-type well 18 having the guard-ring 19 formed therein and the N-type drain region 17 are shorted, the LDMOS device having the structure shown in FIG. 1 may have the following advantages. More specifically, when a current flows inversely in a circuit due to an inductor in a bridge circuit, a voltage higher than that of the drain may be supplied to the source/body regions of the LDMOS, as shown in FIG. 2.

Referring to FIG. 2, when a PNP parasitic transistor (PNP1) is driven, a hole current may leak in the direction of the P-type substrate (or P-substrate) 10. However, at the same time, since a hole current also flows towards a PNP parasitic transistor (PNP2) formed by the P-type well 18, a current amplification ratio (or current gain; Hfe) of the parasitic PNP may be reduced.

Accordingly, due to the electrical properties (or characteristics) of the inductor, when current flow is reversed in the circuit, the hole current may be prevented from leaking into the p-type substrate (P-SUB) 10.

Figure 3:
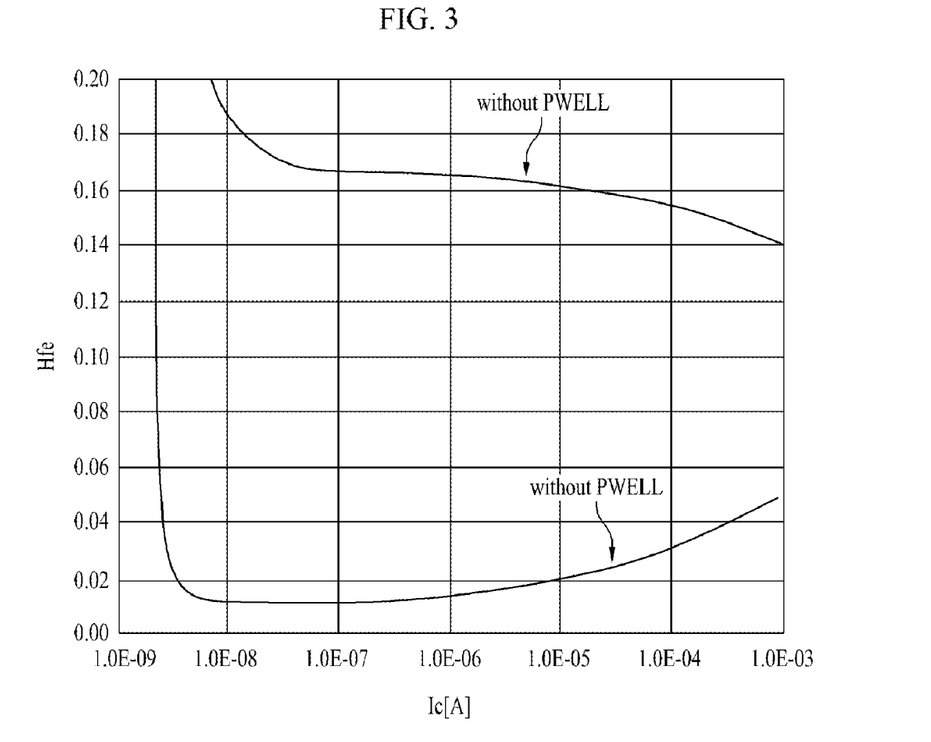
FIGS. 3 and 4 illustrate graphs verifying the electrical characteristics when a P-type well (P-WELL) is formed in an N-type deep well, and when a P-type well (P-WELL) is not formed in an N-type deep well, respectively.

Such characteristics may be illustrated in the form of a graph, as shown in FIG. 3.

FIG. 3 illustrates a graph showing a change in current gain of a parasitic PNP, when the P-type well 18 having a guard-ring 19 is formed in the N-type deep well 12, and when the P-type well 18 having a guard-ring 19 is not formed in the N-type deep well 12.

As shown in FIG. 3, when a P-type well 18 having a guard-ring 19 is formed in an N-type deep well 12, the parasitic current gain (Hfe) is largely reduced. Conversely, when the P-type well 18 having a guard-ring 19 is not formed in the N-type deep well 12, the growth in the current gain is substantial.

Therefore, the graph shown in FIG. 3 indicates that the P-type well 18 may effectively decrease the current gain of the parasitic PNP1.

However, the above-described structure has the following disadvantages.

Figure 4:
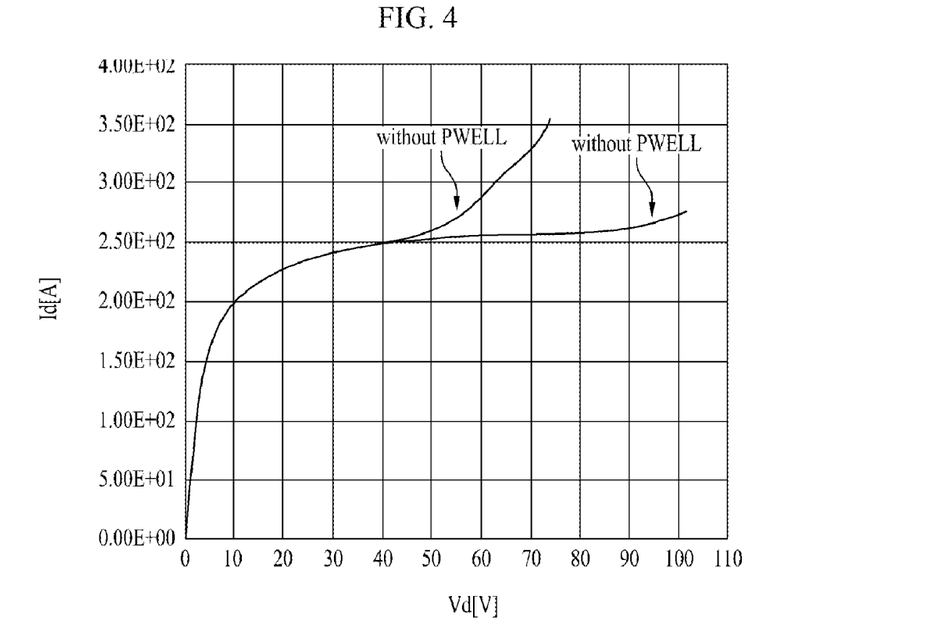

FIG. 4 illustrates Id-Vd curves when a P-type well 18 is formed in the N-type deep well 12, and when a P-type well 18 is not formed in the N-type deep well 12.

Referring to FIG. 4, when a P-type well 18 is not formed in the N-type deep well 12, a breakdown voltage (Bvii) is about 120V, whereas, when a P-type well 18 is formed in the N-type deep well 12, the breakdown voltage decreases to about 73V. More specifically, by forming a P-type well 18 in the N-type deep well 12, the current gain of the parasitic PNP may be reduced, thereby reducing the amount of current leaking to the P-type substrate 10 from the N-type drain region 17. Such current leakage causes problems in the LDMOS, such as noise. However, this structure may lead to deterioration in the SOA characteristics of the LDMOS device.

The above-described effect will be described in detail with reference to the electrical properties (or characteristics) shown in FIG. 5.

Figure 5:
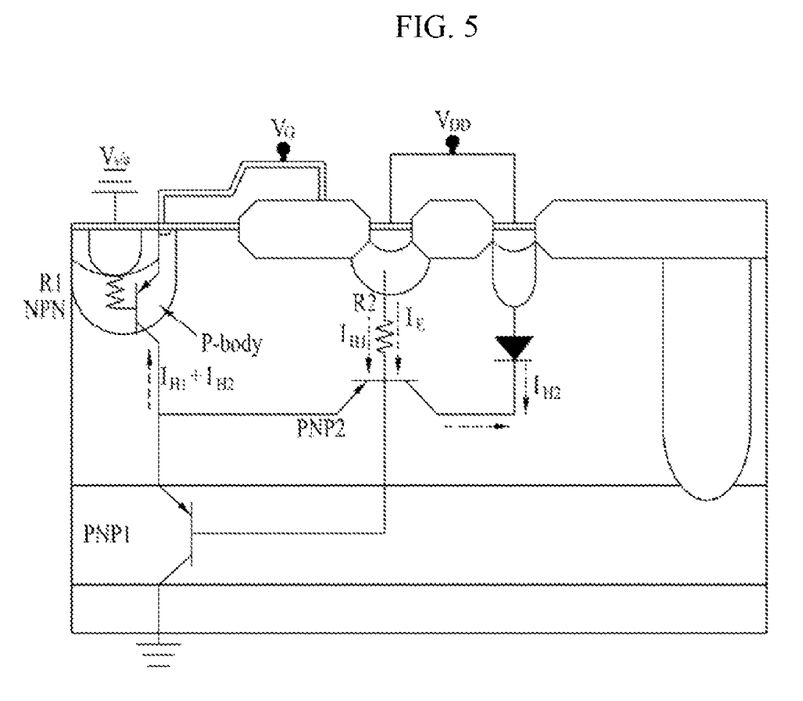
FIG. 5 illustrates a view showing electrical characteristics, when the LDMOS is operated.

FIG. 5 illustrates a view showing electrical characteristics, when the LDMOS is operated by supplying a +voltage using a drain voltage (Vd) and a +voltage using a gate voltage (Vg).

As shown in FIG. 5, during the operation of the LDMOS device, electrons move to the N-type shallow well 16 (see FIG. 1 for identification numbers of the structures in FIG. 5). However, in this case, a resistance (R2) may be formed in a drift region, thereby causing a voltage drop. Since the P-type well 18 is shorted in the drain region, the voltage drop occurring in the drift region may also occur in the P-type well 18.

More specifically, a hole current may flow outside of the P-type well 18 and move towards the P-type body 13. Due to this current flow, the operation of an NPN formed near the P-type body 13 may be accelerated. Accordingly, due to the resistance (R2) formed in the drain region, a PN junction between the P-type well 18 and the N-type shallow well 16 is turned on with a forward bias or in a forward direction (e.g., forward turn on).

Thereafter, when the PN junction is turned on, the hole current flows to the P-type body 13, thereby turning the parasitic NPN1 on. This may cause deterioration of the SOA characteristics of the LDMOS device.

Accordingly, the LDMOS device that controls current from leaking to the substrate and that can also enhance the SOA characteristics is required. Such semiconductor device may be provided by using the LDMOS device described in further detail below.

Figure 6:
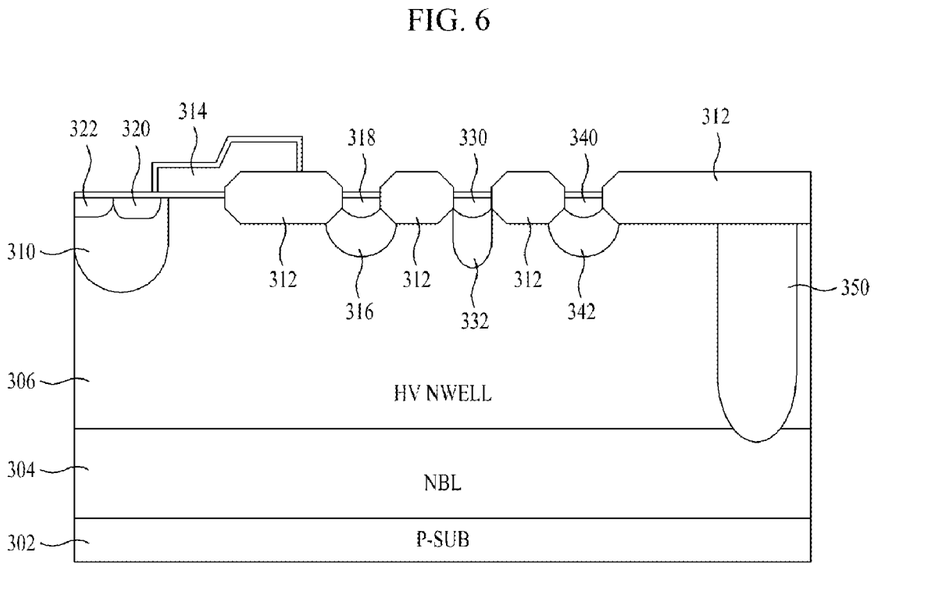
FIG. 6 illustrates a view showing the structure of an LDMOS device according to various embodiments of the present invention.

FIG. 6 illustrates a view showing the structure of an exemplary LDMOS device according to the present invention.

The LDMOS device shown in FIG. 6 has a structure that maintains the guard-ring 330 and the N$^+$-type deep well 306 structures of the above-described LDMOS device and that can also enhance the SOA characteristics.

Referring to FIG. 6, the P-type semiconductor substrate 302 may include an N-type buried layer 304 and a P-type epitaxial layer (not shown). Herein, the N-type buried layer 304 is formed on the P-type semiconductor substrate 302.

A P-type body 310 is formed in the N-type deep well 306. When a voltage is supplied to the N$^+$-type drain region 318, the N-type buried layer 304 decreases the width of a depletion region, which is extended from the P-type body (P-body) 310, thereby substantially increasing the punch through voltage. Additionally, the P-type epitaxial layer reduces the resistance of the substrate 302.

A channel region is formed in accordance with a bias voltage applied to a gate electrode 314 near the surface of the P-type body 310, which is formed between a contacting surface contacting the P-type body 310, the N-type deep well 306, and the N$^+$-type source region 320.

Thereafter, an insulating layer (e.g., field oxide) 312 is formed in the active region and the field region of the semiconductor device. The insulating layer 312 may include a field oxidation layer, such as thermally grown or developed silicon oxide, which may be formed by wet or dry thermal oxidation.

In the semiconductor substrate 302, an N-type shallow well 316 and an N-type drain region 318 are formed in the N-type deep well 306, and an N-type source region 320 is formed in the P-body 310. A P-type impurity layer 322 is formed to facilitate contact with the P-body 310.

Additionally, for preventing current from leaking to a substrate axis to the drain region, a P-type well 332 is formed in an region adjacent to the N$^+$-type drain region 318, and a guard-ring 330 having P$^+$-type ions are implanted therein, is formed in the P-type well 332. The P$^+$ region formed in the P-type well 332 is referred to as the guard-ring. However, in the viewpoint of forming the parasitic NPN transistor or the PNP transistor, the P-type well 332 may also be functionally referred to as a guard-ring.

In other words, the first guard-ring includes a P-type well 332 and/or a P$^+$-type impurity region 330.

Also, in the region neighboring the guard-ring 330, an N-type well guard-ring 342 is formed between the insulating layers 312. An N$^+$-type region 340 having N$^+$-type impurities implanted therein is in the N-type well guard-ring 342. Also, the second guard-ring may include an N-type well 342 or an N$^+$-type impurity region 340.

Furthermore, an N$^+$-type deep well 350 is formed on the lower surface of the field oxide layer 312, neighboring the second guard-ring 340 and/or 342. According to the various embodiments of the present invention, the N$^+$-type deep well 350 may be referred to as a third guard-ring.

The N$^+$-type deep well 350 (e.g., third guard-ring) is in the N$^+$-type deep well 306 neighboring the N-type well 342. As the third guard-ring 350, the N$^+$-type deep well 350 decreases leakage current and enhances SOA characteristics along with the first and second guard-rings 330 and/or 332 and 340 and/or 342, respectively. More specifically, the SOA characteristics respective to the N-type well 342 are particularly enhanced.

The electrical characteristics of the LDMOS device having the above-described structure will now be described with reference to FIG. 7.

Figure 7:
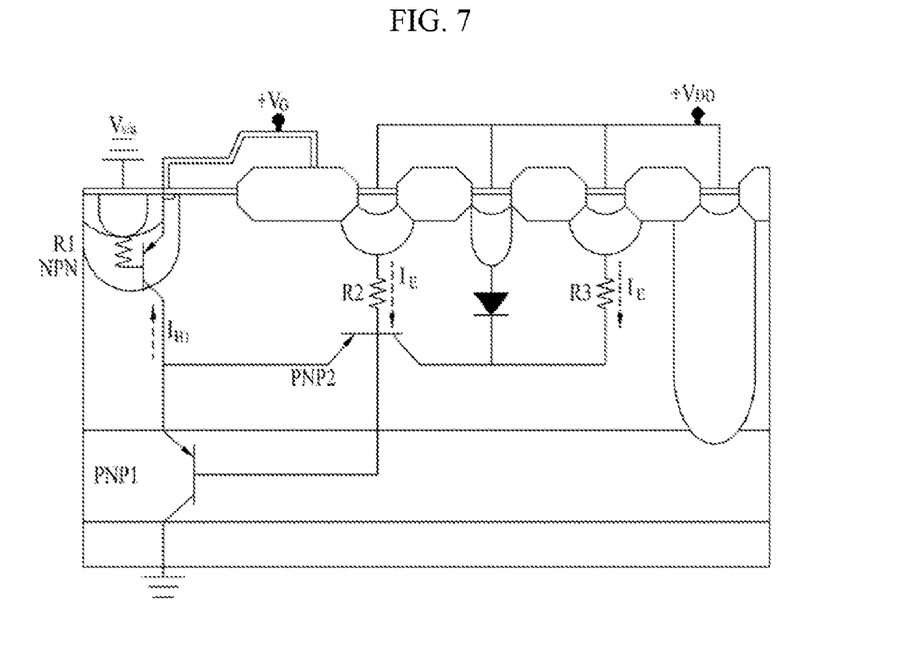
FIG. 7 illustrates a view showing the operations of the LDMOS device according to various embodiments of the present invention.

FIG. 7 illustrates a view showing the operations of the LDMOS device according to various embodiments of the present invention.

The second guard-ring (e.g., the N-type well) 342 is formed between the P-type well 332, which is a dummy P-body, and the N$^+$-type deep well 350. The N-type well 342 as illustrated in FIG. 7, creates a path enabling electric current to flow through. Thus, the resistance of the conventional circuit may be enhanced similarly to the resistance of a parallel circuit.

More specifically, as shown in FIG. 7, an electric current may flow from the N-type shallow well (e.g., the drain region) 316 and from the N-type well (e.g., second guard-ring) 342. Various embodiments of the present disclosure enable forming the resistance in a parallel structure, thereby reducing the resistance of the drift region.

Since V=I×R, when the resistance is reduced, the voltage drop is proportionally reduced. As a result, the operation of the parasitic NPN transistor formed by the P-body 310 decelerates.

Therefore, by having a structure comprising the N-type well 342, the PNP parasitic transistor PNP2 formed by the conventional N-type shallow well and the P-type well, and the current gain of the parasitic PNP transistor PNP1 may be maintained, while the breakdown voltage is reduced.

Figure 8:
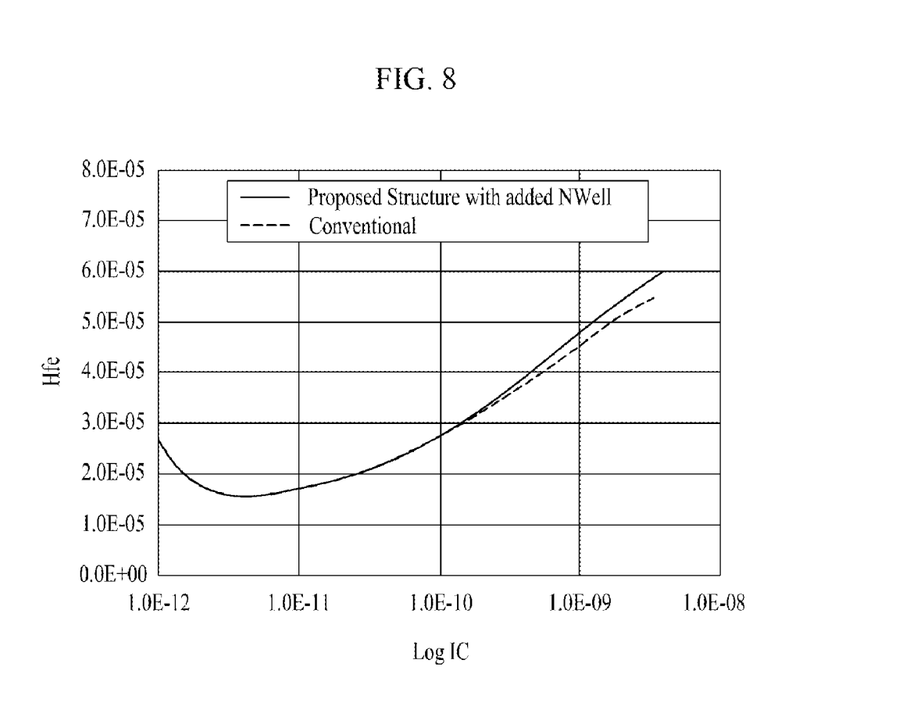
FIG. 8 illustrates a graph comparing current amplification ratios (or current gains) in an LDMOS device having a guard-ring structure including an N-type well and in an LDMOS device having a guard-ring structure without an N-type well according to various embodiments of the present invention.
Figure 9:
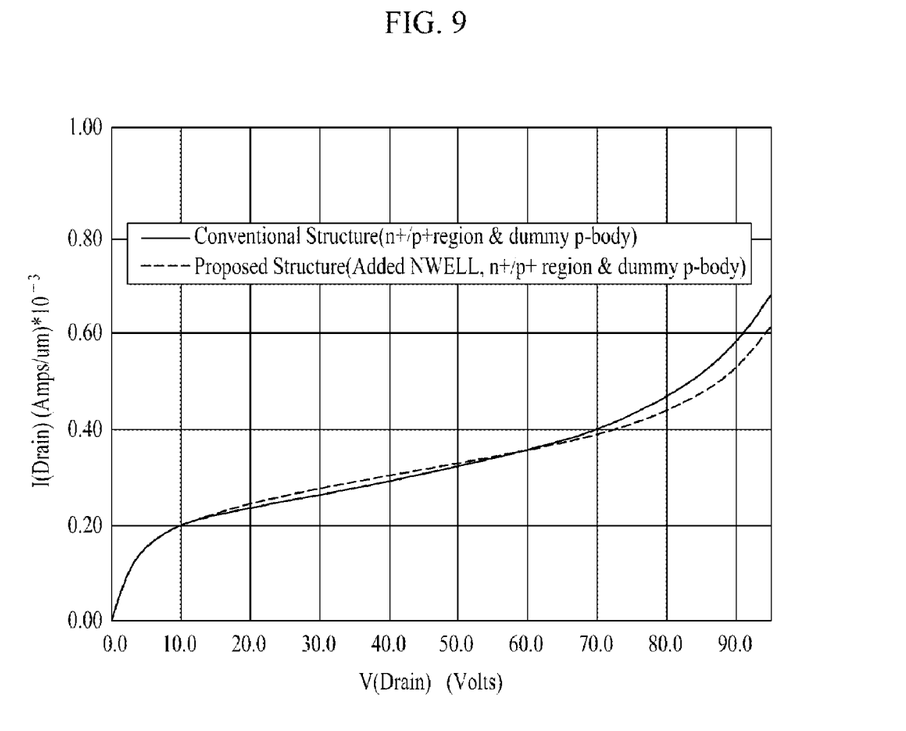
FIG. 9 illustrates a graph comparing Vd-Id characteristics between an LDMOS device not including any guard-ring structure for decreasing leakage current and an LDMOS device having a guard-ring structure including an N-type well according to various embodiments of the present invention.

This result may be verified through the graphs shown in FIG. 8 and FIG. 9.

FIG. 8 illustrates a graph comparing current amplification ratios (or current gains) in an LDMOS device having a guard-ring structure including an N-type well and in an LDMOS device having a guard-ring structure without an N-type well according to various embodiments of the present invention. FIG. 9 illustrates a graph comparing Vd-Id characteristics between an LDMOS device not including any guard-ring structure for decreasing leakage current, and an LDMOS device having a guard-ring structure including an N-type well according to various embodiments of the present invention.

FIG. 8 corresponds to a graph comparing the LDMOS device according to various embodiments of the present invention to the LDMOS device shown in FIG. 1, wherein the current gain is maintained.

The SOA characteristics of the LDMOS device shown in FIG. 1 deteriorate due to the deterioration in the Id-Vd characteristics. However, FIG. 9 shows a graph comparing a LDMOS device having favorable Id-Vd characteristics to Id-Vd characteristics of the LDMOS according to embodiments of the present invention.

As shown in the graphs, the guard-ring structure having the N-type well according to various embodiments of the present invention provides a low growth in electric current, enabling slow operation of the parasitic NPN transistor.

Therefore, the LDMOS device according to embodiments of the present invention advantageously reduces the current gain due to the guard-ring structure of various embodiments of the present invention, and enhances the SOA characteristics as compared to conventional LDMOS devices.

A method for manufacturing the LDMOS device according to various embodiments of the present invention will be described in further detail.

FIGS. 10 to 15 illustrate a method for manufacturing an LDMOS device according to various embodiments of the present invention, respectively.

Figure 10:
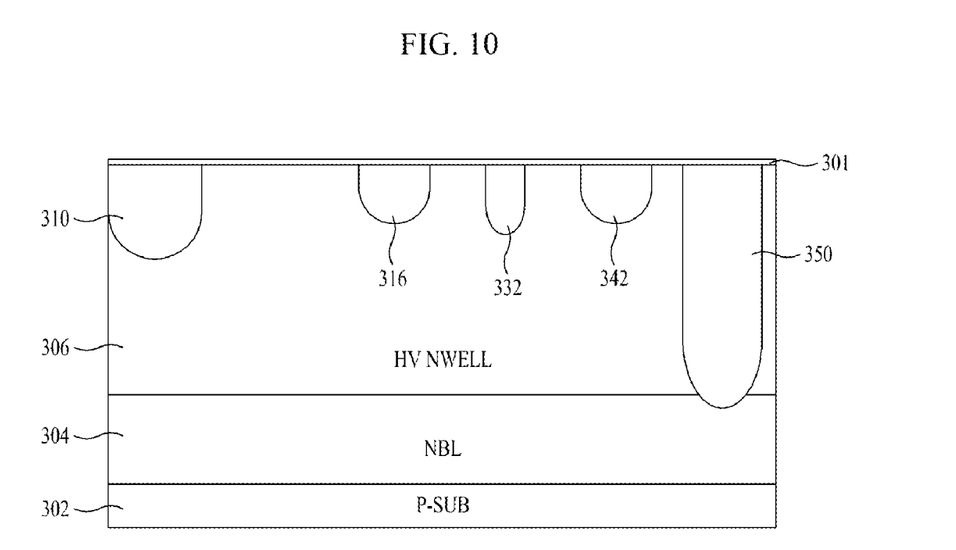
FIGS. 10 to 15 illustrate a method for manufacturing an LDMOS device according to various embodiments of the present invention, respectively.

Referring to FIG. 10, the P-type semiconductor substrate 302 may include an N-type buried layer 304 and a P-type epitaxial layer (not shown). Herein, the N-type buried layer 304 is formed on the P-type semiconductor substrate 302, and the P-type epitaxial layer (not shown) may be formed on the N-type buried layer 304.

Also, by performing multiple ion implantation processes on the semiconductor substrate 302, the P-body 310, and the N-type shallow well 316 may be formed, and the P-type well 332, N-type well 342, and N$^+$-type deep well 350 may be formed as the guard-rings.

In some embodiments of the present invention, the P-type well 332, the N-type well 342, and the N$^+$-type deep well 350 are spaced apart at a predetermined distance. The P-type well 332 is in the first guard-ring, the N-type well 342 is in the second guard-ring, and the N$^+$-type deep well 350 is in the third guard-ring.

After forming the P-type body 310 in the source region, the N$^+$-type shallow well 316 in the drain region, and configuring the well regions as the first, second, and third guard-rings, a pad oxide layer 301 is formed on the semiconductor substrate 302.

The pad oxide layer 301 may be formed by applying heat to the semiconductor substrate 302 (e.g., thermal growth in an oxidizing atmosphere or ambient).

Meanwhile, when defining the semiconductor substrate 302 as a substrate doped with a first conductor-type, the P-type body 310 may be referred to as a body region having a first conductor-type implanted (or injected) therein. The N-type shallow well 316 may be referred to as a well region having a second conductor-type implanted (or injected) therein. As the first guard-ring, the P-type well 332 may be referred to as a first guard well region having the first conductor-type implanted therein. As the second guard-ring, the N-type well 342 may be referred to as a second guard well region having the second conductor-type implanted therein. And, as the third guard-ring, the N+-type deep well 350 may be referred to as a third guard well region having the second conductor-type implanted therein.

Figure 11:
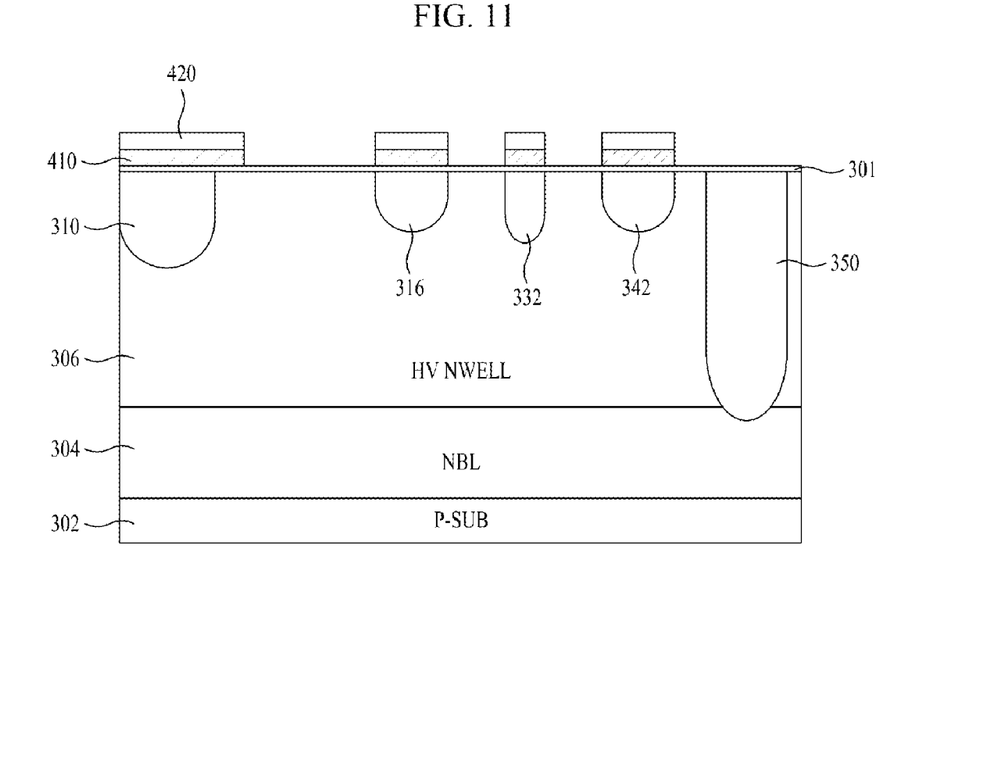

Thereafter, referring to FIG. 11, a nitride film 410 is deposited on the pad oxide layer 301. For patterning the nitride film, a first photoresist pattern 420 is formed on the nitride film 410.

Using the first photoresist pattern 420 as an etch mask, the nitride film 410 is treated with an etching process, patterning the nitride film in the pattern shown in FIG. 11.

The nitride film 410 is patterned, so as to remain in the active region of the LDMOS device. Furthermore, a portion of the pad oxide layer exposed during the process of removing the first photoresist pattern 420 may be removed.

Figure 12:
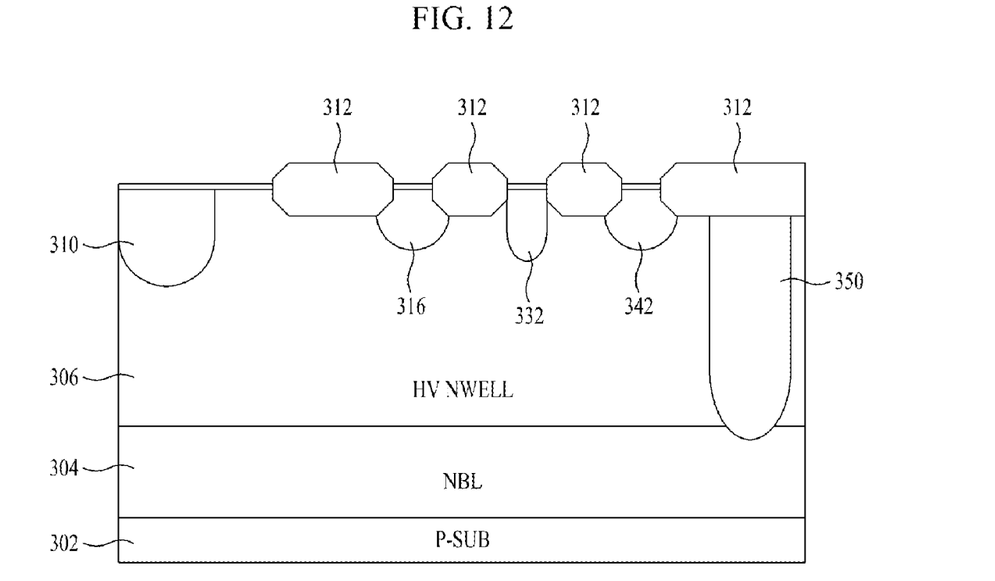

Performing a thermal oxidation process on the nitride film 410 using a mask, a field oxide layer 312 may be formed, as shown in FIG. 12. The field oxide layer 312 is formed in a region positioned between the P-type well 332 (e.g., the first guard-ring) and the N-type shallow well 316 (e.g., the drain region) and also in a region positioned between the P-type well 332 and the N-type well 342 (e.g., the second guard-ring).

Moreover, the field oxide layer 312 is also formed on the N$^+$-type deep well 350. After forming the field oxide layer 312 using the thermal oxidation process, the nitride film 410 is removed.

Figure 13:
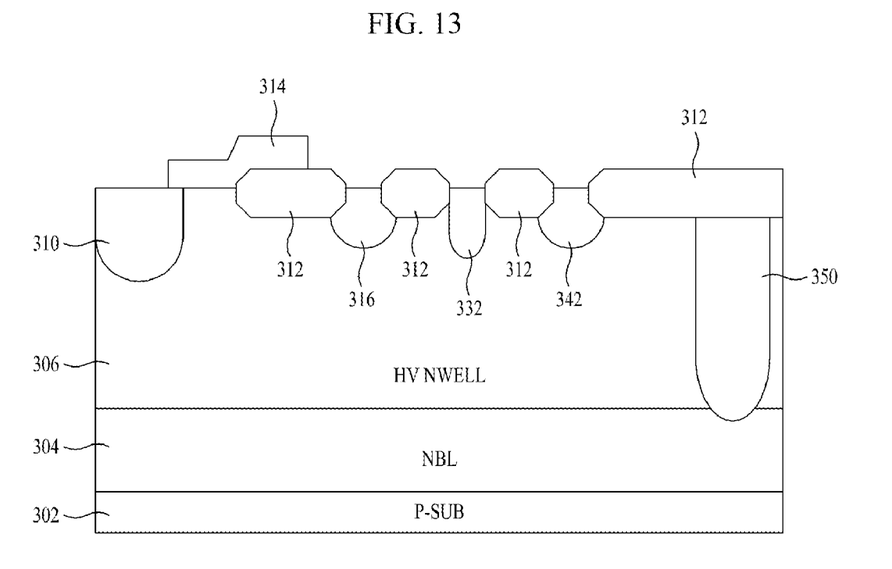

Subsequently, referring to FIG. 13, a gate oxide film is formed on partially exposed regions of the semiconductor substrate 302, and the P-type body 310. Then, a gate electrode 314 is formed on the gate oxide film and at least part of the field oxide layer 312.

Figure 14:
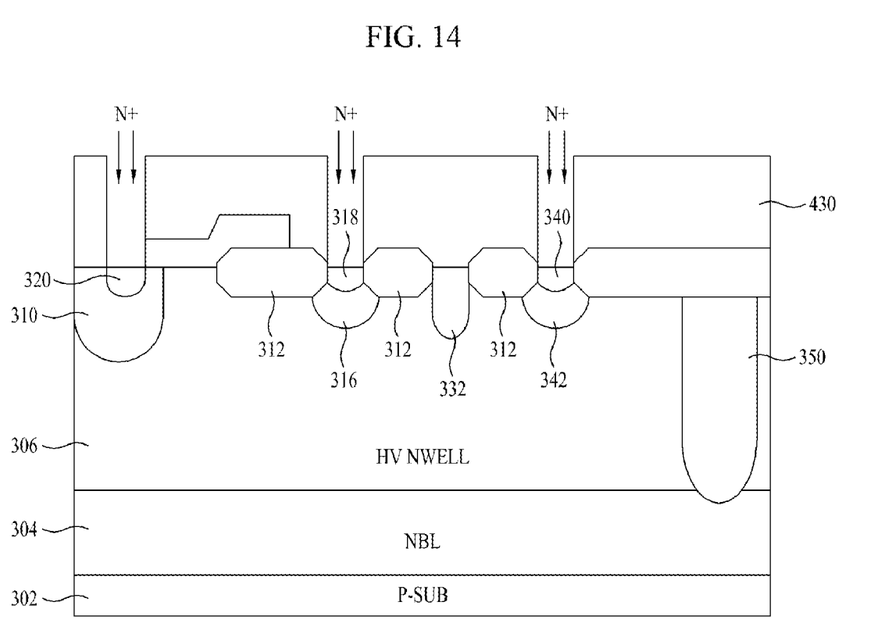

Thereafter, referring to FIG. 14, an ion implant process for injecting N-type impurities (e.g., second conductor-type) is performed, and a second photoresist pattern 430 is formed on all regions excluding the region in which the N-type impurities are to be injected.

More specifically, the surface of the substrate that is exposed by the second photoresist pattern 430 respectively corresponds to the N-type source region 320 of the P-type body 310, the N-type drain region 318, and the N$^+$-type impurity region 340 that is formed in the N-type well 342 (e.g., the second guard-ring).

After performing the ion implant process using the N-type impurities, the second photoresist pattern is removed.

Figure 15:
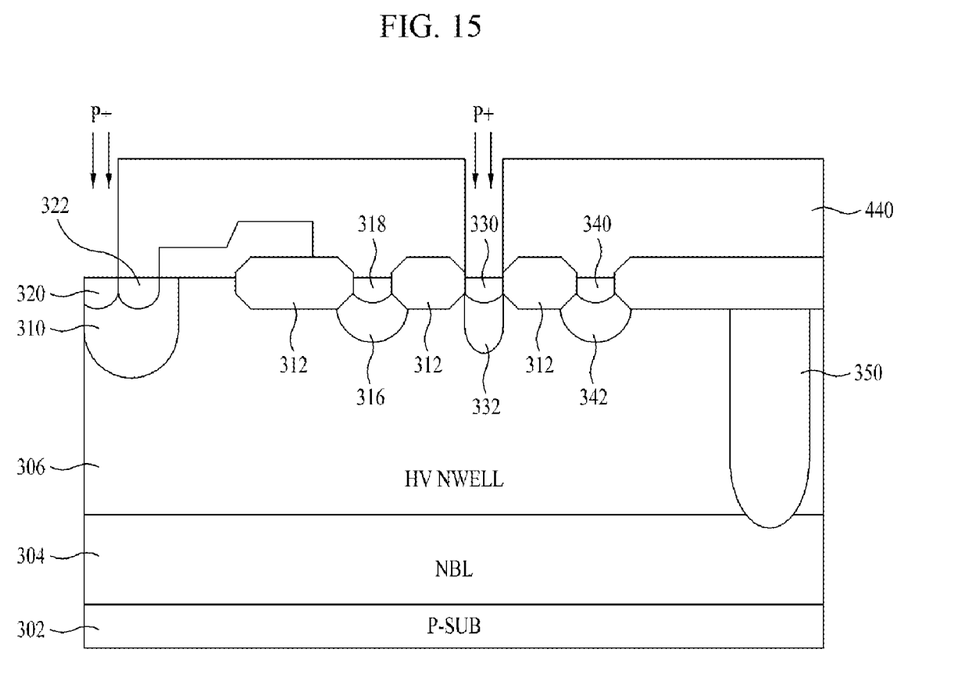

Subsequently, referring to FIG. 15, an ion implant process for injecting P-type impurities (e.g., first conductor-type) is performed, and a third photoresist pattern 440 is formed on all regions excluding the region in which the P-type impurities are to be injected.

More specifically, the surface of the substrate that is exposed by the third photoresist pattern 440 respectively corresponds to the P$^+$-type impurity layer 322 in the P-type body 310 and the P$^+$-type impurity region 330 that is formed in the P-type well 332 (e.g., the first guard-ring).

After performing the ion implant process using the P-type impurities, the third photoresist pattern 440 is removed.

In the above-described method for manufacturing the LDMOS device according to various embodiments of the present invention, the P-type impurities, which correspond to the first conductor-type, are injected after injecting the N-type impurities, which correspond to the second conductor-type. According to other embodiments of the present invention, the ion implant process for injecting the N-type impurities after injecting the N-type impurities may be used.

By performing the above-described process, the LDMOS device having the structure shown in FIG. 6 is complete.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor device comprising:
a substrate having a first conductor-type;
a buried layer having a second conductor-type on or over the substrate;
a drain; and
a first guard-ring on one side of the drain, a second guard-ring on one side of the first guard-ring, and a third guard-ring on one side of the second guard-ring, wherein the first guard-ring comprises a first conductor-type well and an impurity region, the impurity region being within the first conductor-type well.

2. The semiconductor device of claim 1, wherein the second guard-ring comprises a second conductor-type well and an impurity region, the impurity region being in the second conductor-type well.

3. The semiconductor device of claim 1, wherein a field oxide layer is in a region between the second guard-ring and the first guard-ring.

4. The semiconductor device of claim 1, wherein the second guard-ring comprises an N-type well having N-type impurities injected therein, and an N-type impurity region within the N-type well.

5. The semiconductor device of claim 1, wherein a field oxide layer is between the first guard-ring and the drain of the semiconductor device.

6. The semiconductor device of claim 1, wherein the third guard-ring corresponds to an impurity region having impurities of the second conductor-type therein, and the field oxide layer is on the substrate above an upper side of the third guard-ring.

7. The semiconductor device of claim 6, wherein the impurities of the second conductor-type comprise N-type impurities.

8. A lateral double diffusion MOSFET (LDMOS), comprising the semiconductor device of claim 1.

9. The semiconductor device of claim 1, wherein the third guard-ring comprises a second conductor-type well.

10. The semiconductor device of claim 9, wherein the second-conductor-type well comprises an N-type well.

11. A semiconductor device comprising:
a substrate having a first conductor-type, an active region and a field region;
a second conductor-type deep well in the substrate;
a first conductor-type body in the deep well;
a gate electrode on or over the active region;
a second conductor-type drain region and a second conductor-type source region in the body and in the deep well;
a first guard well in the second conductor-type deep well and having first conductor-type impurities therein;
a second guard well in the deep well and having second conductor-type impurities therein; and
a third guard well in the deep well and having second conductor-type impurities therein.

12. The semiconductor device of claim 11, wherein the first guard well is spaced apart from the second drain region at a predetermined distance by a field oxide layer.

13. The semiconductor device of claim 11, wherein the second guard well is spaced apart from the first guard well at a predetermined distance by a field oxide layer.

14. The semiconductor device of claim 11, wherein the second guard well comprises a P-type well, and a $P^+$-type impurity region formed in the P-type well.

15. The semiconductor device of claim 11, wherein a field oxide layer is on the third guard well.

16. The semiconductor device of claim 11, wherein the second conductor-type deep well comprises an N-type deep well.

17. The semiconductor device of claim 11, wherein the second guard well further comprises an impurity region.

18. The semiconductor device of claim 17, wherein the impurity region comprises an N-type impurity region, the N-type impurity region within the second guard well.

19. The semiconductor device of claim 11, wherein the second conductor-type impurities comprise N-type impurities.

20. A lateral double diffusion MOSFET (LDMOS) comprising the semiconductor device of claim 11.

* * * * *